US011570922B2

(12) United States Patent
Choi et al.

(10) Patent No.: US 11,570,922 B2
(45) Date of Patent: Jan. 31, 2023

(54) ELECTRONIC APPARATUS ATTACHABLE TO SURFACE OF 3D STRUCTURE HAVING CURVED SURFACE AND METHOD OF MANUFACTURING THE SAME

(71) Applicants: SEOUL NATIONAL UNIVERSITY R&DB FOUNDATION, Seoul (KR); George Mason Research Foundation, Inc., Fairfax, VA (US)

(72) Inventors: In Suk Choi, Seoul (KR); Yu Ki Lee, Seoul (KR); Young Joo Lee, Seoul (KR); Jyh-Ming Lien, Oakton, VA (US)

(73) Assignees: Seoul National University R&DB Foundation, Seoul (KR); George Mason Research Foundation, Inc., Fairfax, VA (US)

( * ) Notice: Subject to any disclaimer, the term of this patent is extended or adjusted under 35 U.S.C. 154(b) by 48 days.

(21) Appl. No.: 17/054,742

(22) PCT Filed: May 10, 2019

(86) PCT No.: PCT/KR2019/005628
§ 371 (c)(1),
(2) Date: Nov. 11, 2020

(87) PCT Pub. No.: WO2019/216691
PCT Pub. Date: Nov. 14, 2019

(65) Prior Publication Data
US 2021/0227713 A1    Jul. 22, 2021

(30) Foreign Application Priority Data

May 11, 2018    (KR) .......................... 10-2018-0054346

(51) Int. Cl.
*H05K 7/02*      (2006.01)
*G06T 17/20*     (2006.01)
*H01M 10/04*     (2006.01)

(52) U.S. Cl.
CPC ............... *H05K 7/02* (2013.01); *G06T 17/20* (2013.01); *H01M 10/04* (2013.01)

(58) Field of Classification Search
CPC .......... H05K 7/02; H01M 10/04; G06T 17/20
See application file for complete search history.

(56) References Cited

U.S. PATENT DOCUMENTS

2015/0170424 A1   6/2015  Golovinskiy et al.
2015/0375445 A1*  12/2015 Grundhofer ............ B29C 51/46
                                                    700/98

(Continued)

OTHER PUBLICATIONS

Xi, Zhonghua et al. "Learning to Segment and Unfold Polyhedral Mesh from Failures," Computers & Graphics. vol. 58, Aug. 31, 2016, pp. 139-149 [retrieved on Jul. 30, 2019], Retrieved from [URL: https://www.sciencedirect.com/science/article/pii/S0097849316300656]. See p. 145; and figures 6,9.

(Continued)

*Primary Examiner* — Michelle Chin
(74) *Attorney, Agent, or Firm* — Kilpatrick Townsend & Stockton LLP

(57) ABSTRACT

Provided is a method of manufacturing an electronic apparatus, the method including approximating a surface of a three-dimensional (3D) structure with two-dimensional (2D) meshes, forming a developed view by developing the 2D meshes, manufacturing an electronic apparatus having the same shape as a shape of the developed view, and attaching the electronic apparatus to the surface of the 3D structure.

10 Claims, 16 Drawing Sheets

(56) References Cited

U.S. PATENT DOCUMENTS

2017/0026728 A1   1/2017  Elko
2017/0091997 A1   3/2017  Tuffreau
2021/0019939 A1*  1/2021  Hu ......................... G06T 17/20

OTHER PUBLICATIONS

Lee, Yu-ki et al., "Computational paper wrapping transforms non-stretchable 2D devices into wearable and conformable 3D devices", Nov. 30, 2018, pp. 1-20 [retrieved on Jul. 30, 2019], Retrieved from [URL: https//arxiv.org/abs/1812.00003], See pp. 1-20.
International Search Report for PCT/KR2019/005628 dated Aug. 23, 2019, all pages.

* cited by examiner

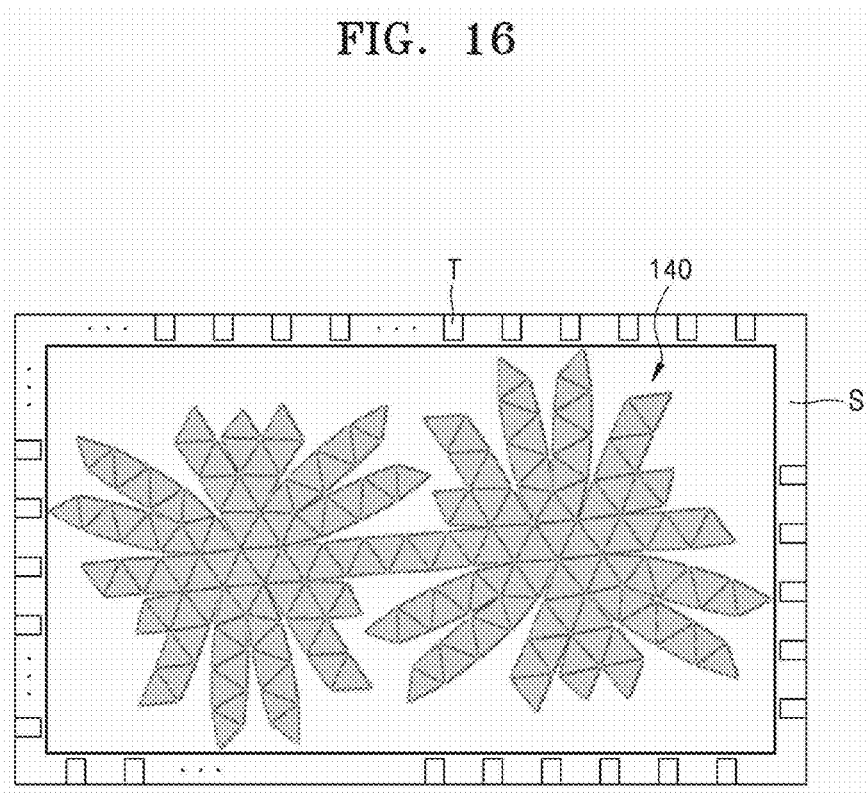

ELECTRONIC APPARATUS ATTACHABLE TO SURFACE OF 3D STRUCTURE HAVING CURVED SURFACE AND METHOD OF MANUFACTURING THE SAME

STATEMENT AS TO RIGHTS TO INVENTIONS MADE UNDER FEDERALLY SPONSORED RESEARCH AND DEVELOPMENT

This invention was made with government support under grant number 1240459 awarded by the National Science Foundation. The government has certain rights in the invention.

TECHNICAL FIELD

One or more embodiments relate to an electronic apparatus capable of being attached to a surface of a three-dimensional (3D) structure having a curved surface without generating crinkles or folds, and a method of manufacturing the electronic device.

BACKGROUND ART

Recently, design elements of electronic apparatuses have become a significant factor in purchasing electronic apparatuses, and accordingly electronic apparatuses having a predetermined curved surface have been introduced. For example, flat-panel display apparatuses according to the related art have been developed into curved display apparatuses, flexible display apparatuses, etc., and moreover, research has been conducted into stretchable display apparatuses having a deformable shape. However, an electronic device such as a display apparatus is manufactured in a flat state, and thus a curved surface generally maintains a flat state in a direction even when a flexible display apparatus has a curved shape. That is, the Gaussian curvature is 0.

DESCRIPTION OF EMBODIMENTS

Technical Problem

An internal surface of a vehicle or a human body has a three-dimensional (3D) shape with a positive or negative Gaussian curvature, and thus, it is impossible to transform an electronic apparatus having a Gaussian curvature of 0 into a 3D shape having positive or negative Gaussian curvature without generating crinkle or folding. That is, when an electronic apparatus having a Gaussian curvature of 0 is transformed into a 3D shape having a positive or negative Gaussian curvature, crinkle, bending, or folding is inevitably generated due to stress applied to the electronic apparatus, and accordingly, the electronic apparatus may break.

Solution to Problem

According to an aspect of the disclosure, provided are an electronic apparatus capable of attaching to a surface of a three-dimensional (3D) structure having a curved surface without generating crinkles or folding, and a method of manufacturing the electronic device.

According to an embodiment, there is provided a method of manufacturing an electronic apparatus, the method including approximating a surface of a three-dimensional (3D) structure with two-dimensional (2D) meshes, forming a developed view by developing the 2D meshes, manufacturing an electronic apparatus having a same shape as a shape of the developed view, and attaching the electronic apparatus to the surface of the 3D structure.

According to another embodiment, there is provided an electronic apparatus attached to a surface of a three-dimensional (3D) structure, the electronic apparatus including: a substrate comprising a plurality of branches; and electronic devices formed on the plurality of branches, from among the plurality of branches, two adjacent branches are connected to each other at one end and are separated from each other at the other end, the plurality of branches are developed on a two-dimensional (2D) plane, and the plurality of branches are located so that side surfaces thereof are in contact with one another three-dimensionally.

Advantageous Effects of Disclosure

According to one or more embodiments, a surface of a three-dimensional (3D) structure is developed two-dimensionally, and then an electronic apparatus manufactured according to the developed view is attached to the surface of the 3D structure. Thus, the electronic apparatus may be attached to the surface of the 3D structure having a curved surface in close contact with the surface, without generating crinkles or folding.

BRIEF DESCRIPTION OF DRAWINGS

FIG. 16 is a plan view illustrating processes of manufacturing an electronic apparatus according to an embodiment.

BEST MODE

Figure 1:
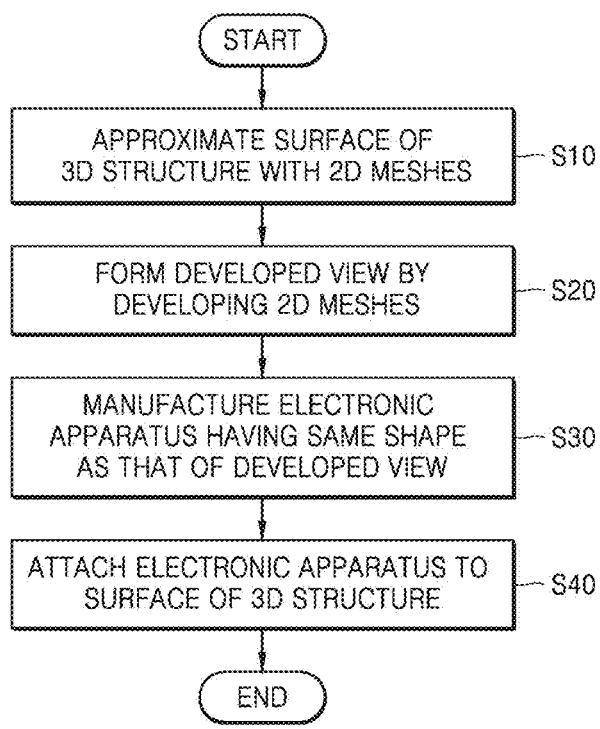
FIG. 1 is a flowchart illustrating a method of manufacturing an electronic apparatus according to an embodiment.

Provided is a method of manufacturing an electronic apparatus, the method including approximating a surface of a three-dimensional (3D) structure with two-dimensional (2D) meshes, forming a developed view by developing the 2D meshes, manufacturing an electronic apparatus having a same shape as a shape of the developed view, and attaching the electronic apparatus to the surface of the 3D structure.

Each of the 2D meshes may have a triangular shape.

The 2D meshes in the developed view may not overlap one another.

The developed view may include a plurality of branches including the 2D meshes, and two adjacent branches from among the plurality of branches may be connected to each other at one end and may be separated from each other at the other end.

Cutting portions for partially cutting an edge of each of the plurality of branches may be formed at a location between the 2D meshes.

The electronic apparatus may include a substrate and an electronic device formed on the substrate, the substrate may be cut according to the developed view, and the substrate may be cut so as to include a terminal formed at an edge of the substrate before cutting.

According to another embodiment, there is provided an electronic apparatus attached to a surface of a three-dimensional (3D) structure, the electronic apparatus including: a substrate comprising a plurality of branches; and electronic devices formed on the plurality of branches, from among the plurality of branches, two adjacent branches are connected to each other at one end and are separated from each other at the other end, the plurality of branches are developed on a two-dimensional (2D) plane, and the plurality of branches are located so that side surfaces thereof are in contact with one another three-dimensionally.

The 3D structure may include a curved surface having a positive or negative Gaussian curvature.

The plurality of branches may include cutting portions for partially cutting an edge of each of the branches in a width direction thereof.

Some of the plurality of branches may further include terminals.

Other aspects, features and advantages of the disclosure will become better understood through the accompanying drawings, the claims and the detailed description.

MODE OF DISCLOSURE

As the present disclosure allows for various changes and numerous embodiments, particular embodiments will be illustrated in the drawings and described in detail in the written description. However, this is not intended to limit the present disclosure to particular modes of practice, and it is to be appreciated that all modifications, equivalents, and/or alternatives that do not depart from the spirit and technical scope are encompassed in the disclosure. In the description, certain detailed explanations of the related art are omitted when it is deemed that they may unnecessarily obscure the essence of the present disclosure.

It will be understood that although the terms "first" and "second" are used herein to describe various elements, these elements should not be limited by these terms. Terms are only used to distinguish one element from other elements.

The terms used in the present specification are merely used to describe particular embodiments, and are not intended to limit the present disclosure. An expression used in the singular encompasses the expression of the plural, unless it has a clearly different meaning in the context. The elements shown in the drawings may be exaggerated, omitted or schematically drawn for the purpose of convenience or clarity. In addition, the size of elements does not utterly reflect an actual size.

In the description of the embodiments, it will be understood that, when an element is referred to as being "on" or "under" another element, it can be "directly" or "indirectly" on the other element, or one or more intervening elements may also be present. Such a position of the element has been described with reference to the drawings.

Hereinafter, the exemplary embodiments will be described in detail with reference to the accompanying drawings. In the drawings, like reference numerals denote like or corresponding elements, and repeated descriptions thereof will be omitted.

Figure 2:
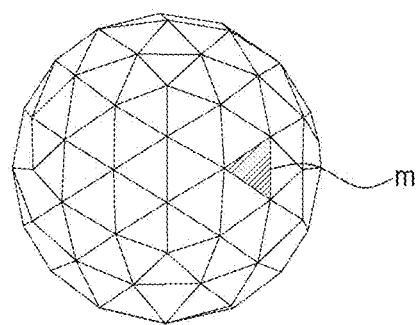
FIG. 2 is a perspective view showing an example in which a surface of a three-dimensional (3D) structure of FIG. 1 is approximated with two-dimensional (2D) meshes.
Figure 3:
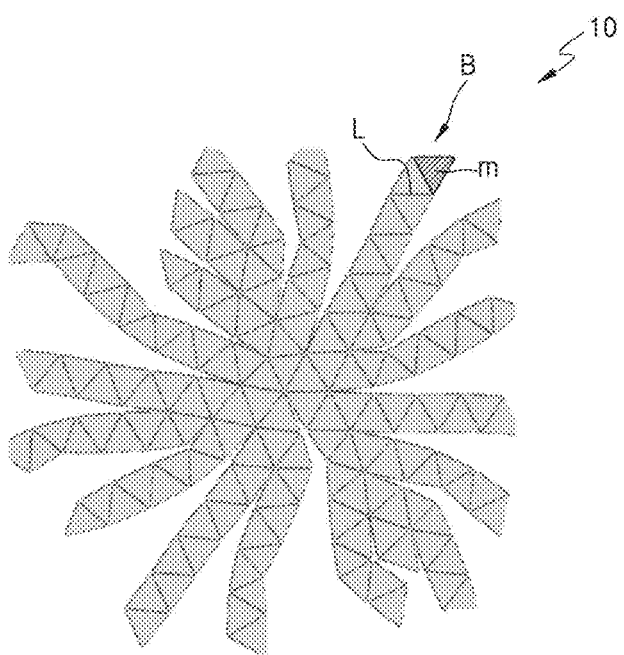
FIG. 3 is a plan view showing an example of a developed view of the 2D meshes in FIG. 2.
Figure 4:
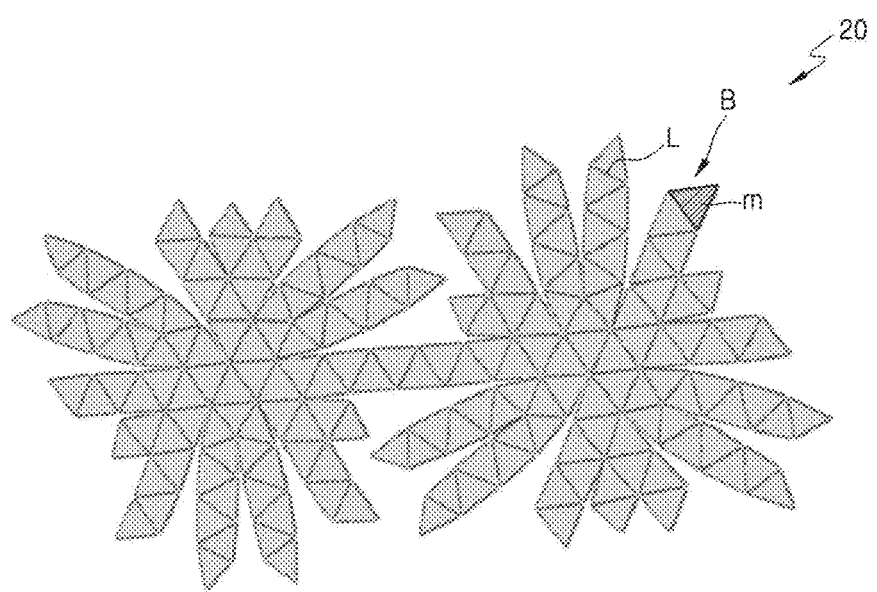
FIG. 4 is a plan view showing another example of a developed view of the 2D meshes in FIG. 2.
Figure 5:
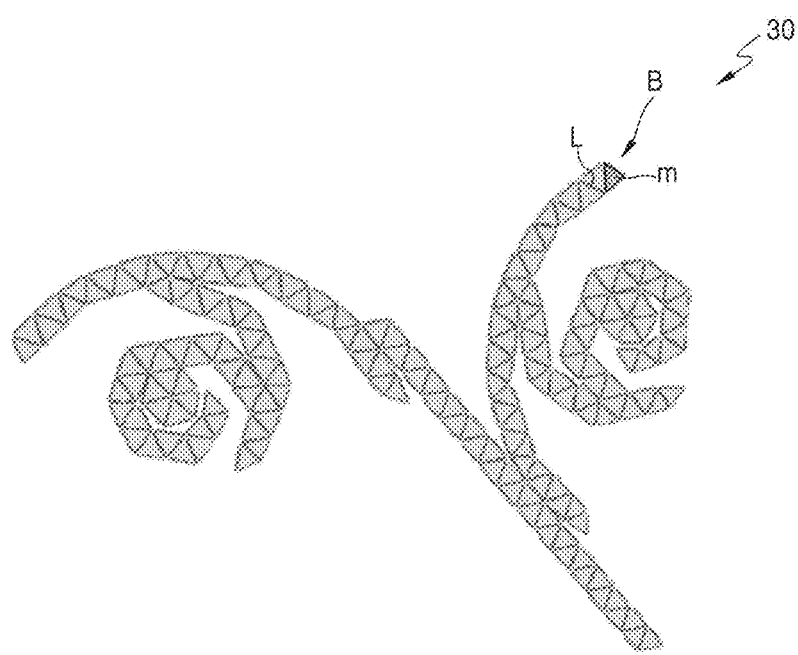
FIG. 5 is a plan view showing another example of a developed view of the 2D meshes in FIG. 2.

FIG. 1 is a flowchart illustrating a method of manufacturing an electronic apparatus according to an embodiment, FIG. 2 is a perspective view showing an example in which a surface of a three-dimensional (3D) structure of FIG. 1 is approximated with two-dimensional (2D) meshes, and FIGS. 3 to 5 are plan views showing examples of developed views of the 2D meshes in FIG. 2.

Referring to FIG. 1, the method of manufacturing an electronic apparatus according to an embodiment may include approximating a surface of a 3D structure with 2D meshes (S10), forming a developed view by developing the 2D meshes (S20), manufacturing an electronic apparatus having the same shape as that of the developed view (S30), and attaching the electronic apparatus to the surface of the 3D structure (S40).

The 3D structure includes at least one curved surface. The curved surface may have a positive or negative Gaussian curvature. Examples of the 3D structure may include a curved portion of a vehicle, a part of a human body, an architecture, etc.

A surface of the 3D structure may be approximated with 2D meshes m and modeled as shown in FIG. 2. FIG. 2 shows an example in which a spherical surface is approximated with meshes m, but one or more embodiments are not limited thereto, that is, the 3D structure may have various shapes. Each of the meshes m has a triangular shape, and two adjacent meshes m may have shapes bent from each other.

As the number of meshes m increases, modeling with the meshes m becomes more similar to the shape of the 3D structure. For example, when a sphere having a radius of 4 cm is approximated with different numbers of meshes m, an area of the meshes m is greater than a surface area of the sphere by 1.1% when the number of meshes m is 500, whereas an area of the meshes m is greater than the surface area of the sphere by 6.4% when the number of meshes m is 80. This is because, as the number of meshes m increases, the number of contact points between the meshes m and the 3D structure also increases, and accordingly spaces between the meshes m and the 3D structure are reduced.

The meshes m approximated to the shape of the 3D structure may be developed as a 2D plane to form a developed view. The meshes m may be spreadable not overlapping each other in various manners and various developed views may be formed according to various developing methods.

FIG. 3 shows a developed view 10 that is formed by developing the meshes m by a steepest edge method.

Developing of the meshes m may be performed by cutting some of cutting lines L at connecting portions among the meshes m. As a result, the developed view 10 may include a plurality of branches B. From among the plurality of branches B, two adjacent branches B have ends connected to each other and the other ends separated from each other. Also, each of the plurality of branches B includes a plurality of meshes m.

The steepest edge method is a method of cutting from the highest point to the lowest point based on a vector c as straight as possible, from among a set of points configuring a 3D figure, when a 3D reference vector c is given. Therefore, the developed view according to the steepest edge method exhibits a radial shape like an expanded bud.

FIG. 4 shows a developed view 20 formed by developing the meshes m by a flat tree method. The flat tree method is a method of connecting meshes m along an edge that is nearly perpendicular to the vector c, from among edges forming a 3D figure based on a vertical direction in edges forming a 3D structure, when a 3D reference vector c is given.

FIG. 4 shows a developed view 20 that is obtained by approximating a surface of a sphere with meshes m and developing the meshes by the flat tree method. The developed view 20 includes a plurality of branches B and each of the plurality of branches B may include a plurality of meshes m.

FIG. 5 shows a developed view 30 formed by developing meshes m by an unflat tree method. On the contrary to the flat tree method, the unflat tree method is a method of connecting meshes along an edge nearly horizontal with the vector c based on the vector c, from among the edges forming a 3D figure when the 3D reference vector c is given.

FIG. 5 shows a developed view 30 that is obtained by approximating a surface of a sphere with meshes m and developing the meshes by the unflat tree method. The developed view 30 includes a plurality of branches B and each of the plurality of branches B may include a plurality of meshes m.

As described above, various developed views may be obtained according to the developing methods. The meshes m may be spread not overlapping one another by various methods such as a minimum perimeter method, a maximum perimeter method, etc. in addition to the above-mentioned methods.

After forming the developed view 10, 20, or 30, an electronic apparatus having the same shape as that of the developed view 10, 20, or 30 is manufactured. The electronic apparatus may include various examples such as an illumination device, a display apparatus, a sensor, a battery, etc.

The electronic apparatus may be manufactured by various methods. For example, a substrate of the electronic apparatus is cut first according to the shape of the developed view 10, 20, or 30, and then electronic devices are formed on the cut substrate to manufacture the electronic apparatus. In another example, an electronic apparatus of a flat shape that may be cut is manufactured first, and then the electronic apparatus of the flat shape may be cut according to the shape of the developed view 10, 20, or 30. In another example, an electronic apparatus is manufactured on a substrate according to the developed view, and the substrate may be cut to include the manufactured electronic apparatus.

The electronic apparatus may be attached to a surface of a 3D structure. Here, when the electronic apparatus is rigid, the electronic apparatus may have patterns that are the same as meshes and may be bent among the patterns. In addition, as the number of meshes m increases, a model approximated with the meshes m may become more similar to the shape of the 3D structure. Therefore, as the number of meshes m in a developed view increases, the electronic apparatus manufactured according to the developed view may have increased attachability to the 3D structure. However, when the number of meshes m increases, fine processes for manufacturing the electronic apparatus are necessary, and a processing time increases, which degrades manufacturing efficiency.

On the contrary, when the electronic apparatus is flexible, there is no need to bend among meshes m in the branch B. That is, a bending line L is not formed between meshes m included in the branch B, and instead, the electronic apparatus may be attached to the surface of the 3D structure only by curving the branch B. This will be described in detail later with reference to FIGS. 6 to 9.

Figure 6:
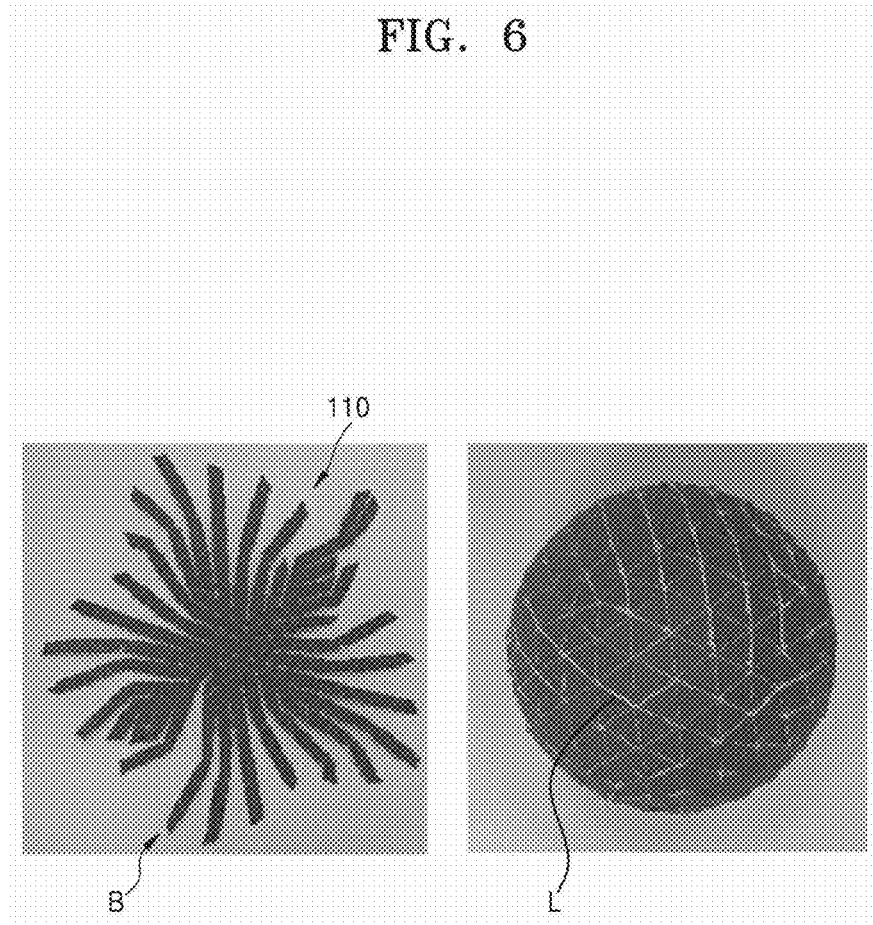
FIG. 6 is a diagram showing an example of a substrate of an electronic apparatus formed according to the developed view of FIG. 1.
Figure 7:
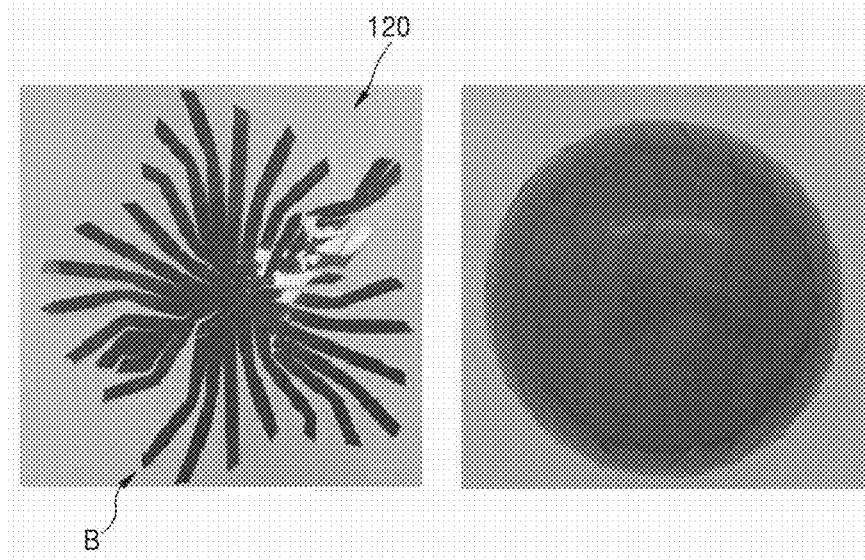
FIG. 7 is a diagram showing another example of a substrate of an electronic apparatus formed according to the developed view of FIG. 1.
Figure 8:
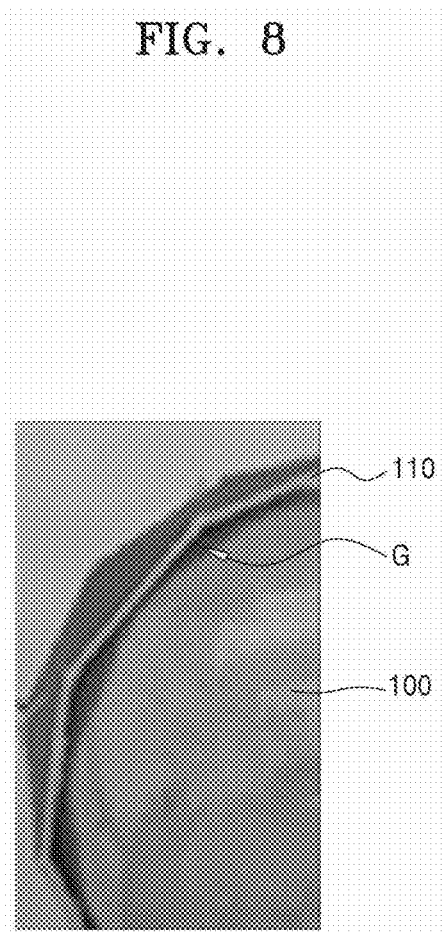
FIG. 8 is a cross-sectional view showing an example of a cross-section of a substrate attached to a 3D structure of FIG. 6.
Figure 9:
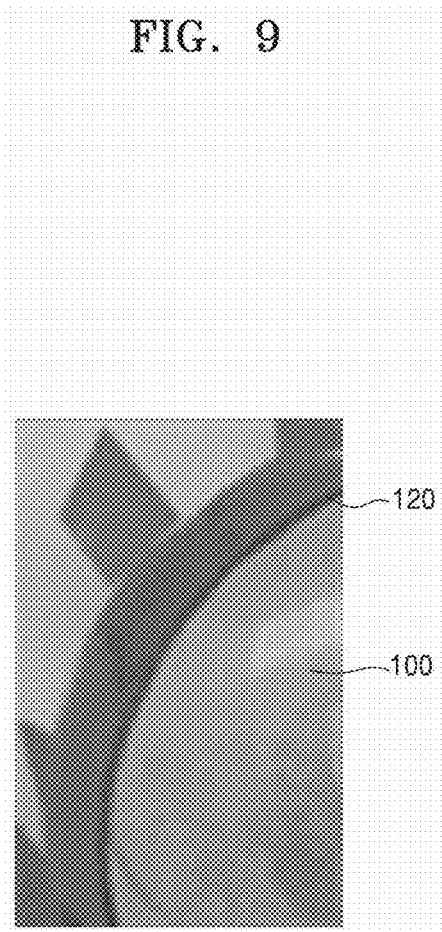
FIG. 9 is a cross-sectional view showing an example of a cross-section of a substrate attached to a 3D structure of FIG. 7.
Figure 10:
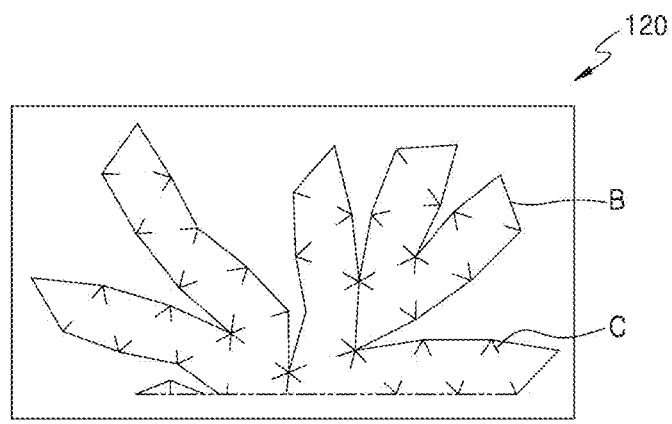
FIG. 10 is a plan view showing a modified example of a substrate of the electronic apparatus of FIG. 7.

FIG. 6 is a diagram showing an example of a substrate of an electronic apparatus manufactured according to the developed view of FIG. 1, FIG. 7 is a diagram showing another example of a substrate of an electronic apparatus manufactured according to the developed view of FIG. 1, FIG. 8 is a cross-sectional view showing an example of a cross-section of a substrate attached to the 3D structure of FIG. 6, FIG. 9 is a cross-sectional view showing an example of a cross-section of a substrate attached to the 3D structure of FIG. 7, and FIG. 10 is a plan view showing a modified example of the substrate in the electronic apparatus of FIG. 7.

FIGS. 6 and 7 respectively illustrate that substrates 110 and 120 are manufactured according to the developed view formed by the steepest edge method and attached to a surface of a sphere, that is, a 3D structure. Here, the substrate 110 of FIG. 6 is rigid. Each of the plurality of branches B includes patterns equivalent to the meshes, and there are bending lines L among the patterns. However, the substrate 120 of FIG. 7 is flexible, and each of the plurality of branches B is integrally provided without forming bending lines L.

FIG. 8 shows a cross-section of a state, in which the substrate 110 of FIG. 6 is attached to a surface of a sphere 100. As shown in FIG. 6, since the branch B is bent a plurality of times at the bending lines L, spaces G exist between the sphere 100 and the substrate 110.

However, as shown in FIG. 9, the substrate 120 that is flexible may be attached to the surface of the sphere 100 in close contact with the surface only by curving the branch B. Also, in a case where the substrate 120 is flexible, even when there is stress while attaching the substrate 120 to the surface of the sphere 100, the stress may be reduced by stretching or contracting the substrate 120. Thus, the substrate 120 may be in close contact with the surface of the sphere 100 without generating crinkles or bending due to the stress, even when the branch B is not bent a plurality of times. Moreover, since the branch B is not bent, damage to circuit devices formed on the branch B caused by the bending may be prevented.

In addition, even when the substrate 120 is flexible, crinkles may generate at edges of the branch B when the branch B has a large width. In this case, a cutting portion C for partially cutting the edge of the branch B may be formed at the location of the bending line L to prevent crinkles from generating, as shown in FIG. 10. That is, when the cutting portion C is formed, the width of the branch B may be increased, and thus an area of the substrate 120 for forming the electronic devices, that is, an area of the branch B, may be increased.

Figure 11:
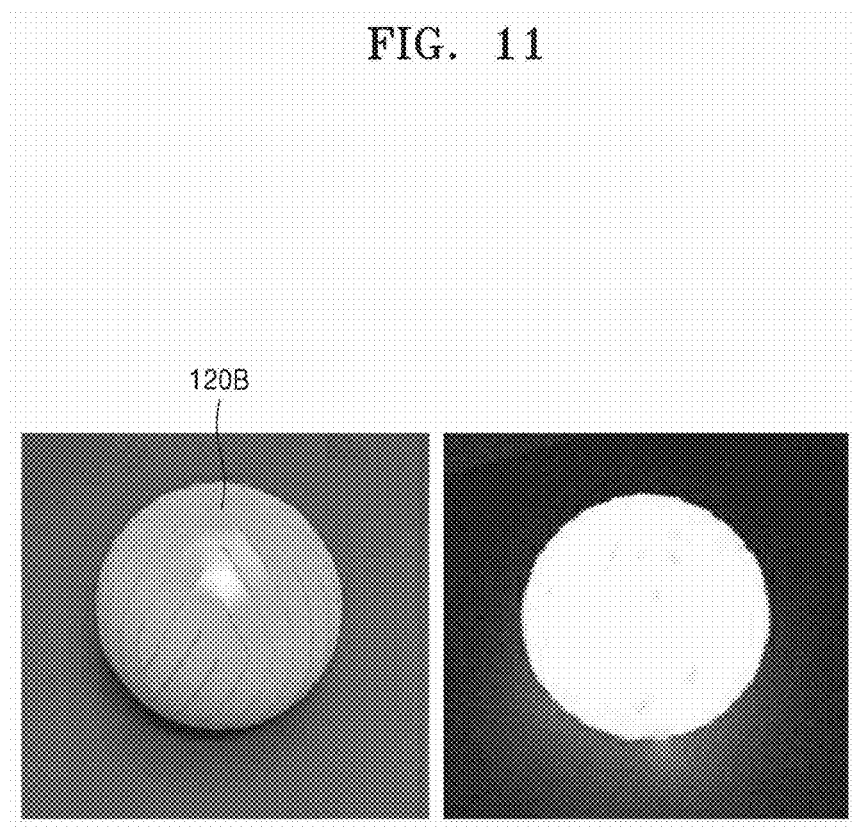
FIG. 11 is a diagram showing an example of an electronic apparatus according to an embodiment.
Figure 12:
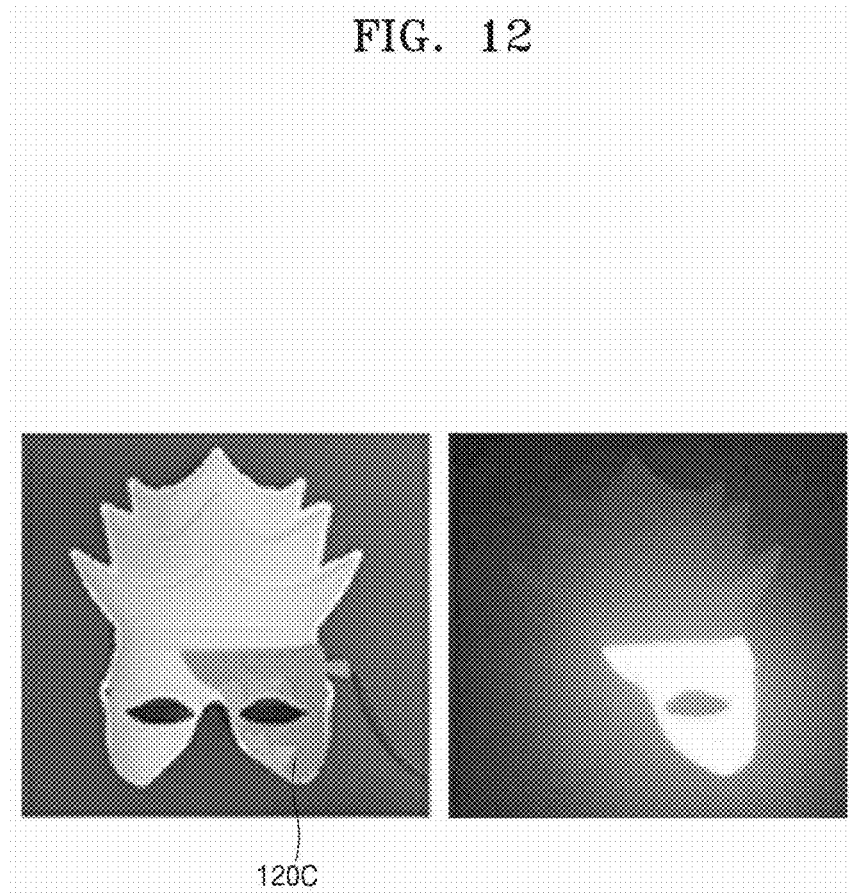
FIG. 12 is a diagram showing another example of an electronic apparatus according to an embodiment.

FIGS. 11 and 12 are diagrams showing examples of the electronic apparatus according to the embodiment.

FIG. 11 shows that an electronic apparatus 120B that is an illumination device covers a surface of a sphere that is the 3D structure. In FIG. 11, the electronic apparatus 120B is the illumination device which is manufactured by cutting an illumination device manufactured as a flat plate, according to a developed view covering the surface of the sphere. Here, the illumination device is manufactured by using a display sheet that may be cut. Since the display sheet that may be cut is flexible, when the electronic apparatus 120B is attached to the surface of the sphere, the electronic apparatus 120B may entirely cover the sphere simply by curving the branches of the electronic apparatus 120B. Accordingly, a brittle layer such as indium tin oxide (ITO) in the display sheet is not damaged due to the bending as shown in a driving result of the electronic apparatus 120B.

In addition, when the electronic apparatus 120B is manufactured by cutting the pre-manufactured electronic apparatus such as the display sheet according to the developed view, the cut electronic apparatus 120B may be simply attached to the surface of the 3D structure, manufacturing processes of an electronic apparatus, in which the electronic apparatus 120B is attached to the surface of the 3D structure, may be simplified.

FIG. 12 shows an example, in which an electronic apparatus 120C is attached to a surface of a 3D structure having more complicated shape than the sphere. The electronic apparatus 120C of FIG. 12 is an illumination device like the electronic apparatus 120B of FIG. 11, and the 3D structure of FIG. 12 shows a human face shape.

The electronic apparatus 120C is manufactured by laser cutting a display sheet that may be cut according to a 2D developed view that is formed by approximating a partial human face shape with meshes and developing the human face shape, and accordingly, a mask for human face may be obtained without any crinkle and there is no damage to the electronic apparatus 120C.

Figure 13:
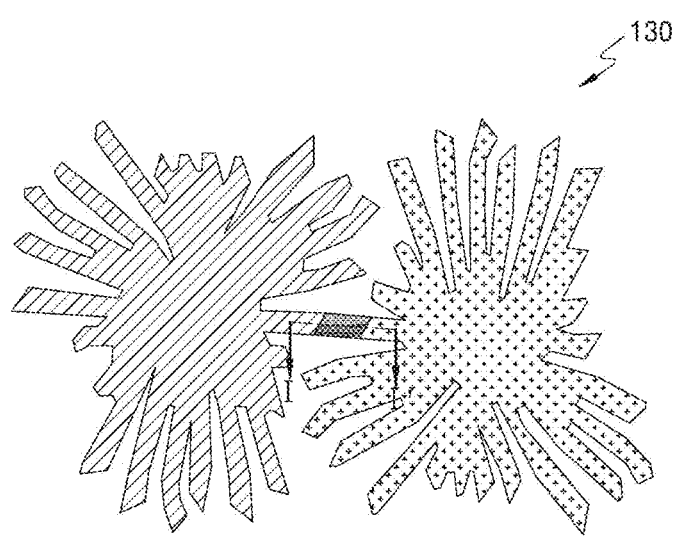
FIG. 13 is a diagram showing another example of an electronic apparatus according to an embodiment.
Figure 14:
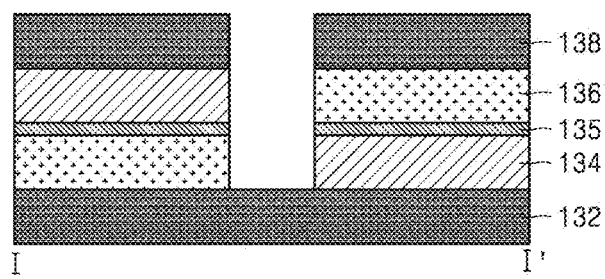
FIG. 14 is a cross-sectional view taken along line I-I' of FIG. 13.
Figure 15:
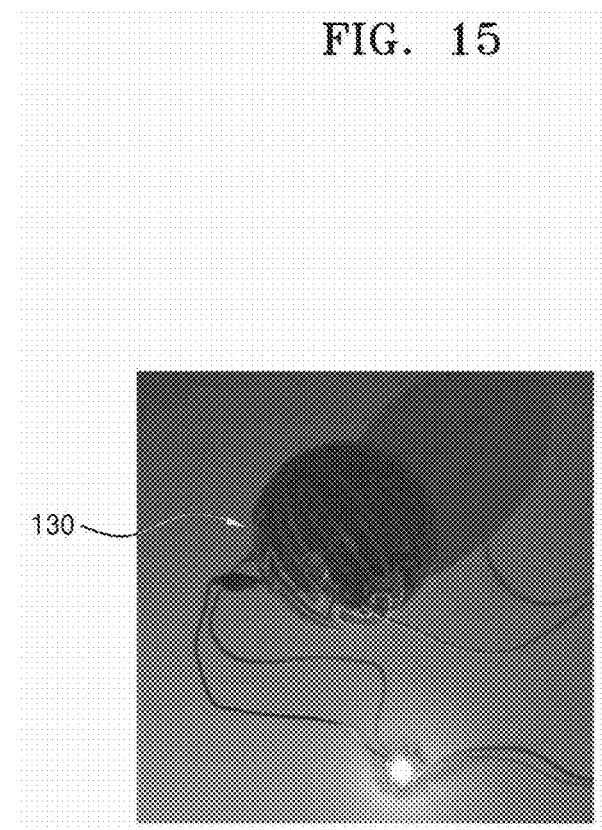
FIG. 15 is a diagram showing an example of applying the electronic apparatus of FIG. 13.

FIG. 13 is a diagram showing another example of an electronic apparatus according to an embodiment, FIG. 14 is a cross-sectional view showing an example of the cross-section taken along line I-I' of FIG. 13, and FIG. 15 is a diagram showing an example of applying the electronic apparatus of FIG. 13.

FIGS. 13 to 15 show an example in which an electronic apparatus 130 is a thin film battery. Unlike the above display sheet that may be cut, when the manufactured thin film battery is cut, the thin film battery may not be stably used because electrolyte, etc. in the thin film battery is exposed to the air, etc. When the electronic apparatus 130 may not be cut as described above, the substrate is cut first according to a developed view, and electronic devices are formed on the substrate to manufacture the electronic apparatus 130. Otherwise, the electronic apparatus 130 is provided on the substrate according to the developed view, and then the substrate may be cut.

FIG. 13 shows the thin film battery that is manufactured according to the developed view that is formed by the flat-tree method in order to utilize the area to the maximum. In addition, referring to FIG. 14, a first active layer 134, a separator 135, a second active layer 136, and a second electrode 138 are sequentially formed on a region of a first electrode 132, and the second active layer 136, the separator 135, the first active layer 134, and the second electrode 138 are sequentially formed on another region of the first electrode 132, which is spaced apart from the above region, to manufacture a thin film battery. The first active layer 134, the second active layer 136, the separator 135, and the second electrode 138 may be formed by using a screen printing process in order to be formed at desired regions.

The electronic apparatus 130 manufactured as above may be stably attached to a surface of a sphere without bending. That is, according to a driving result of the electronic apparatus 130 as shown in FIG. 15, it may be identified that the thin film battery, that is, the electronic apparatus 130, is not damaged when the electronic apparatus 130 is attached to the surface of the sphere.

FIG. 16 is a plan view illustrating processes of manufacturing the electronic apparatus according to an embodiment.

FIG. 16 illustrates an example of a manufacturing process of the electronic apparatus 140, wherein the electronic apparatus 140 may be manufactured by forming an electronic device on a substrate S and cutting the substrate S according to the shape of the electronic apparatus 140. Here, a plurality of terminals T may be further formed on edges of the substrate S. At least one of the plurality of terminals T may be connected to the electronic apparatus 140. When the substrate S is cut so as to include the terminal T connected to the electronic apparatus 140, an additional process of connecting the terminal T to the electronic apparatus 140 may be omitted.

As described above, the electronic apparatus manufactured according to the one or more embodiments may be attached to the surface of a 3D structure having a curved surface in close contact with the surface, without generating crinkles or bending. In addition, the electronic apparatus is not limited to the above-mentioned examples, but may be applied to various industrial fields, e.g., various sensors attached to a human body, a display apparatus attached to a curved surface of a vehicle, etc.

Although the preferred embodiments of the disclosure have been disclosed for illustrative purposes, those skilled in the art will appreciate that various modifications, additions and substitutions are possible, without departing from the scope and spirit of the disclosure as disclosed in the accompanying claims. Such modifications should not be individually understood from the technical spirit or prospect of the disclosure.

The invention claimed is:

1. A method of manufacturing an electronic apparatus, the method comprising:
   approximating a surface of a three-dimensional (3D) structure with two-dimensional (2D) meshes;
   forming a developed view by developing the 2D meshes;
   manufacturing an electronic apparatus having a shape that is the same as a shape of the developed view; and
   attaching the electronic apparatus to the surface of the 3D structure.

2. The method of claim 1, wherein each of the 2D meshes has a triangular shape.

3. The method of claim 1, wherein the 2D meshes in the developed view do not overlap one another.

4. The method of claim 1, wherein the developed view comprises a plurality of branches including the 2D meshes, and two adjacent branches from among the plurality of branches are connected to each other at one end and are separated from each other at the other end.

5. The method of claim 4, wherein a cutting portion for partially cutting an edge of each of the plurality of branches is formed at a location between the 2D meshes.

6. The method of claim 1, wherein the electronic apparatus comprises a substrate and an electronic device formed on the substrate, the substrate is cut according to the developed view, and the substrate is cut so as to include a terminal formed at an edge of the substrate before cutting.

7. An electronic apparatus attached to a surface of a three-dimensional (3D) structure, the electronic apparatus comprising:
   a substrate comprising the plurality of branches; and
   electronic devices formed on the plurality of branches, wherein, from among the plurality of branches, two adjacent branches are connected to each other at one end and are apart from each other at the other end, the plurality of branches are developed on a two-dimensional (2D) plane, and the plurality of branches are located such that side surfaces thereof are in contact with one another three-dimensionally;

wherein the electronic apparatus is configured to approximate a surface of a three-dimensional (3D) structure with two-dimensional (2D) meshes, wherein the electronic apparatus is configured to form a developed view by developing the 2D meshes, the developed view comprise a plurality of branches include the 2D meshes.

8. The electronic apparatus of claim 7, wherein the 3D structure comprises a curved surface having a positive or negative Gaussian curvature.

9. The electronic apparatus of claim 7, wherein the plurality of branches comprise cutting portions for partially cutting an edge of each of the branches in a width direction thereof.

10. The electronic apparatus of claim 7, wherein some of the plurality of branches further comprise terminals.

* * * * *